(12) United States Patent
Hirayama et al.

(10) Patent No.: US 9,025,632 B2
(45) Date of Patent: May 5, 2015

(54) QUANTUM CASCADE LASER ELEMENT

(75) Inventors: Hideki Hirayama, Asaka (JP);
Tsung-Tse Lin, Sendai (JP)

(73) Assignee: Riken, Saitama (JP)

(*) Notice: Subject to any disclaimer, the term of this patent is extended or adjusted under 35 U.S.C. 154(b) by 0 days.

(21) Appl. No.: 14/236,458

(22) PCT Filed: Aug. 1, 2012

(86) PCT No.: PCT/JP2012/069571
§ 371 (c)(1),
(2), (4) Date: Jan. 31, 2014

(87) PCT Pub. No.: WO2013/018824
PCT Pub. Date: Feb. 7, 2013

(65) Prior Publication Data
US 2014/0153603 A1    Jun. 5, 2014

(30) Foreign Application Priority Data
Aug. 2, 2011    (JP) .................. 2011-169455

(51) Int. Cl.
*H01S 5/00* (2006.01)
*H01S 5/34* (2006.01)
(Continued)

(52) U.S. Cl.
CPC .............. *H01S 5/3401* (2013.01); *H01S 5/3402* (2013.01); *B82Y 20/00* (2013.01);
(Continued)

(58) Field of Classification Search
CPC ..... H01S 5/2206; H01S 5/3013; H01S 5/323; H01S 5/32316; H01S 5/3425; H01S 5/343; H01S 5/3216; H01S 5/34
USPC ............................ 372/45.012, 43.01
See application file for complete search history.

(56) References Cited

U.S. PATENT DOCUMENTS 6,829,269 B2* 12/2004 Goodhue et al. ............ 372/43.01
7,848,376 B2* 12/2010 Masselink et al. ....... 372/45.011
(Continued)

OTHER PUBLICATIONS

Williams, "Terahertz Quantum Cascade Laser", Ph.D. Dissertation, MIT 2003. The file is protected, cannot be imported into OACS, http://dspace.mit.edu/bitstream/handle/1721.1/17012/54455783.pdf?sequence=1&sa=U&ei=f3tPU9g7iom0BrvpgMAN&ved=0CCEQFjAB&usg=AFQjCNEIWE48tEpdmWPGd894dq52dt5orQ.*

(Continued)

*Primary Examiner* — Xinning Niu
*Assistant Examiner* — Vu A Vu
(74) *Attorney, Agent, or Firm* — Seed IP Law Group PLLC

(57) ABSTRACT

[PROBLEM] To manufacture a quantum cascade laser (QCL) element having a reduced threshold current density ($J_{th}$) and an increased maximum operating temperature ($T_{max}$).
[SOLUTION] One embodiment of the present invention provides a THz-QCL element (1000) with a QCL structure (100), which is a semiconductor superlattice (100A) sandwiched between a pair of electrodes (20, 30). The semiconductor superlattice (100A) (QCL structure (100)) is provided with an active region (10) that emits THz range electromagnetic waves due to the transition of electrons between sub-bands during application of a voltage to the pair of electrodes, for example. The active region (10) has repeating unit structures (10U) of a thickness, which includes sets of a well layer (10W) and a barrier layer (10B) alternatingly laminated with each other, wherein the well layer (10W) is made of $Al_xGa_{1-x}$ As (where 0<x<1), which is a mixed crystal of AlAs and GaAs.

3 Claims, 12 Drawing Sheets

(51) Int. Cl.
*B82Y 20/00* (2011.01)
*H01S 5/02* (2006.01)

(52) U.S. Cl.
CPC ............ *H01S 5/0014* (2013.01); *H01S 5/0035* (2013.01); *H01S 5/0215* (2013.01); *H01S 5/0217* (2013.01); *H01S 2302/02* (2013.01)

(56) References Cited

U.S. PATENT DOCUMENTS

2003/0219052 A1  11/2003  Goodhue et al.
2010/0054292 A1* 3/2010  Bessho ................... 372/49.01

OTHER PUBLICATIONS

Bellotti et al., "Monte Carlo simulation of terahertz quantum cascade laser structures based on wide-bandgap semiconductors," Journal of Applied Physics 105(11):113103-1-113103-9, Jun. 2, 2009.

Holtz et al., "Pressure dependence of the optic phonon energies in $Al_xGa_{1-x}As$," Physical Review B 54(12):8714-8720, Table I, Sep. 15, 1996.

Kumar, et al., "186 K operation of terahertz quantum-cascade lasers based on a diagonal design," Applied Physics Letters 94(13):131105-1-131105-3, Apr. 1, 2009.

Kagaya et al., "Binding Force and Phonon Dispersion Curves for III-V, II-VI Semiconducting Composites," Bussei Kenkyu 40(6):457-472, Mar. 20, 1984.

Lin et al., "Thermally Activated Longitudinal Optical Phonon Scattering of a 3.8 THz GaAs Quantum Cascade Laser," Applied Physics Express 2:022102-1-022102-3, 2009.

Scalari et al., "Terahertz bound-to-continuum quantum-cascade lasers based on optical-phonon scattering extraction," Applied Physics Letters 86:181101-1-181101-3, 2005.

Sun et al., "Active region design of a terahertz $GaN/Al0.15Ga0.85N$ quantum cascade laser," Superlattices and Microstructures 37:107-113, Oct. 22, 2004.

International Search Report, for PCT/JP2012/069571, mailed Nov. 13, 2012, 4 pages.

* cited by examiner (a)

(b)

(a)

(b)

(a)

(b)

QUANTUM CASCADE LASER ELEMENT

TECHNICAL FIELD

The present invention relates to a quantum cascade laser element. More specifically, the present invention relates to a quantum cascade laser element that emits electromagnetic waves in THz range.

BACKGROUND ART

Recently, a quantum cascade laser, hereinafter called as a "OCL", is gathering much attention as a solid state light source that emits electromagnetic waves in mid infra-red range or in terahertz (THz) range. Having both properties of a light and a radio wave at a time, electromagnetic waves in THz range in particular feature such high resolution capability as a light and such high transmission capability as a radio wave, with milder impact on examined objects than X rays or the like. From these points, electromagnetic waves in THz range are expected to be utilized in applications for, such as, substance identification and human body scanning examination by wave transmission.

Typical emission mechanism of QCLs utilizes a semiconductor superlattice, which uses potentials only by electrons' conduction bands having an alternating structure of wells and barriers, for example. In short, stimulated emissions by way of intersubband transition are provoked among the subbands that are created in the semiconductor superlattice. The emission mechanism in QCLs is significantly differ from one in conventional semiconductor lasers in this respect, in which stimulated emissions of electromagnetic wave are provoked by way of recombination of an electron and a hole across an energy gap between a conduction band and a valence band. Specifically, QCLs use a potential in a semiconductor superlattice with wells and barriers, and, by applying a voltage thereto, the potential is inclined along thickness direction of the semiconductor superlattice while having well/barrier undulating patterns. The inclined patterned potential is then used to provoke stimulated emissions by electrons in a multi stage manner, or in a cascade scheme. To fabricate a semiconductor superlattice that is capable of such transitions, it is necessary to conduct "band engineering" in which thicknesses of well and barrier layers are precisely designed in consideration of the inclination due to the electric field. In QCLs, repeated use of conduction carriers, or electrons, enables a carrier recycling.

In QCLs, it is possible to cause lasing operation with a wavelength that has no relationship at all with an energy gap of material for the semiconductor superlattice, and on top of that, the lasing wavelength can be tuned through designing process of the semiconductor superlattice. For these reasons, QCLs have been made for emission of electromagnetic waves emitters in THz range, for which wavelength no solid state light source was devised. Such QCLs in the THz range, or hereinafter called "THz-QCLs", have been classified into several types in view of schemes to make population inversion for lasing. One example of THz-QCLs is called "bound-to-continuum" type, in which the electromagnetic wave is emitted by electrons that make transition from an isolated level to a miniband that forms a continuum band. A THz-QCL of this type is disclosed in Non-Patent Document 1, in which the THz-QCL operates at an oscillation frequency of 3.65 GHz, where the population inversion is created by relaxing electrons in a lower lasing level by way of electron-electron scattering within the miniband. It should be noted that THz-QCLs of bound-to-continuum type may have high voltage efficiency; however, such THz-QCLs need complicated designing and suffer from significant adverse effects of scattering by LO-phonon.

Another type of THz-QCLs is disclosed in Patent Document 1 (U.S. Pat. No. 6,829,269). The THz-QCL disclosed in Patent Document 1 uses three electronic levels per one stage of stimulated emission. That is, one additional electronic level is adopted to form population inversion between an upper lasing level and a lower lasing level that need the population inversion for lasing operation. The THz-QCL in Patent Document 1 adopts an upper lasing level (|3>, referred to as "level L3" in the present specification), a lower lasing level (|2>, "level L2"), both of which are related to the lasing operation, and another level (|1>, "level L1") located below the level L2. The level L1 operates to depopulate electrons from the level L2 by using longitudinal optical phonon ("LO-phonon"), (see for example, FIG. 3 in Patent Document 1). Such a three-level scheme is hereinafter called "LO-phonon assist type".

Patent Document 1 discloses a THz-QCL of the LO-phonon assist type that has a semiconductor superlattice provided with repeating structures in its active region for stimulated emissions, where each structure, hereinafter called simply as "unit structure," is configured to realize each stage of stimulated emission. The unit structure includes an emission region and an injection region. Energy potentials, or a band, in the unit structure have been engineered in such a way that the emission region improves the emission efficiency and that the injection region helps formation of the population inversion. In the active region of LO-phonon assist type THz-QCLs, well layers are made of GaAs, whereas barrier layers are made of $Al_xGa_{1-x}As$ to implement such design.

REFERENCES

Patent Document

Patent Document 1: U.S. Pat. No. 6,829,269
Non-Patent Documents
Non-Patent Document 1: G Scalari, N. Hoyler, M. Giovannini, and J. Faist, Appl. Phys. Lett. No. 86, 181101 (2005)
Non-Patent Document 2: S. Kumer, Q. Hu, and J. Reno, Appl. Phys. Lett. No. 94, 131105 (2009)
Non-Patent Document 3: T. T. Lin, K. Ohtani, and H. Ohno, Applied Physics Express, No. 2, 022102 (2009)

SUMMARY OF THE INVENTION

Technical Problem

Among THz-QCLs, ones in LO-phonon assist type as disclosed in Patent Document 1 generally show good performance. For example, a demonstration of lasing operation at 186 K, which is considered a relatively high temperature for THz-QCLs, is reported for the LO-phonon assist type (Non-Patent Document 2). Moreover, the LO-phonon assist type ones have a relatively simple structure in the semiconductor superlattice.

However, LO-phonon assist type THz-QCLs still need further improvement. So long as the highest temperature for actual lasing operation (hereinafter referred to as a maximum operating temperature $T_{max}$) is nothing more than 186 K, it is necessary to provide a large scale cooling system for lasing operation. If the maximum operating temperature $T_{max}$ were raised to 230 K or higher, electronic cooling, such as by a Peltier element, would be sufficient for the lasing operation, which should lead to a significant improvement on usability of the QCLs. It should also be noted that QCLs with raised maximum operating temperature $T_{max}$ usually show a reduced threshold current density for lasing (herein after called as "threshold current density $J_{th}$") in a temperature range below the maximum.

Accordingly, the present invention is devised for solving such problems. That is, by reducing the threshold current density $J_{th}$, or by raising the maximum operating temperature $T_{max}$, for THz-QCLs, the present invention contributes to practicing various applications that adopt THz-OCLs.

Solution to Problem

The inventors of the present application have designed the structures for THz-QCLs such that they have reduced threshold current density $J_{th}$ for lasing, which reduction should be in direct relationship with the operating temperature, and such that they have raised maximum operating temperature $T_{max}$. Also, the inventors estimated their performances based on a numerical calculation based on theory (theoretical calculation). Moreover, it has been confirmed experimentally that changing material of barrier layers from GaAs, which was the only material adopted therefor, to another material gives good agreement with the prospects of the theoretical calculation. Furthermore, the inventors of the present application have obtained a knowledge from the theoretical calculation that changing material of well layers, from only GaAs to another material results in reduced threshold current density $J_{th}$ or raised maximum operating temperature $T_{max}$, in THz-QCLs. The present invention has been made as outlined above.

Accordingly, in one aspect of the present invention, provided is a quantum cascade laser (QCL) element comprising a pair of electrodes and a semiconductor superlattice sandwiched by the pair of electrodes, wherein the semiconductor superlattice has an active region that emits electromagnetic waves of THz range when an voltage is applied between the pair of electrodes, wherein the active region has repeating unit structures, each unit structure having a thickness and including sets of a well layer and a barrier layer alternatingly laminated with each other, and wherein the well layer is made of $Al_xGa_{1-x}As$ (where $0<x<1$), which is a mixed crystal of AlAs and GaAs.

Throughout the present application, an electromagnetic wave in THz range generally denotes an electromagnetic wave in a frequency range of 0.1 THz-30 THz, or in a wavelength range of 10 μm-3 mm. Also through description in the present application, the element structure or its function may be described in technical terms that are diverted or borrowed from optical technologies covering visible lights or infra-red rays, in accordance with the customary usage in the art of the present application. Therefore, although generated electromagnetic waves are those of far different frequency or wavelength range from ones for visible lights, such terms as "laser" or "luminescence" may be used, and such terms as "optical-" or the like may also be used to describe elements of quantum cascade lasers or to describe phenomena of the stimulated emissions.

Advantageous Effect of the Invention

Any of the embodiments of the present invention provides a THz-QCL with reduced threshold current density $J_{th}$, or with raised maximum operating temperature $T_{max}$ than before. Accordingly the present invention contributes to developments of devices that use an emitting source of electromagnetic waves in THz range.

BRIEF DESCRIPTION OF THE DRAWINGS

FIG. 5a depicts an energy dispersion relationship for conventional design; whereas FIG. 5b depicts an energy dispersion relationship for the embodiment of the present invention.

DESCRIPTION OF THE EMBODIMENT

Figure 1:
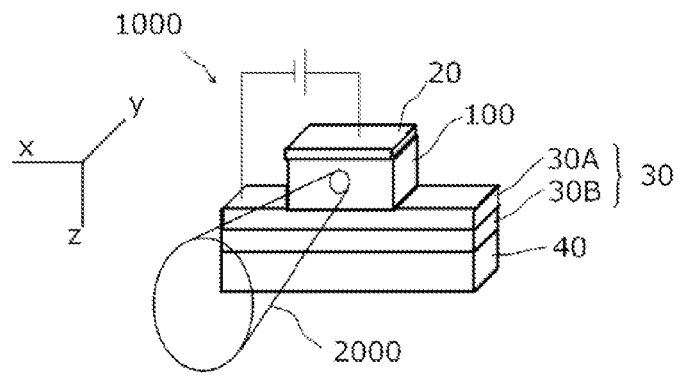
FIG. 1 is a perspective view (FIG. 1a), an enlarged cross sectional view (FIG. 1b), and a further enlarged partial cross sectional view (FIG. 1c), showing general structure of a THz-QCL element in an embodiment of the present invention.
Figure 1:
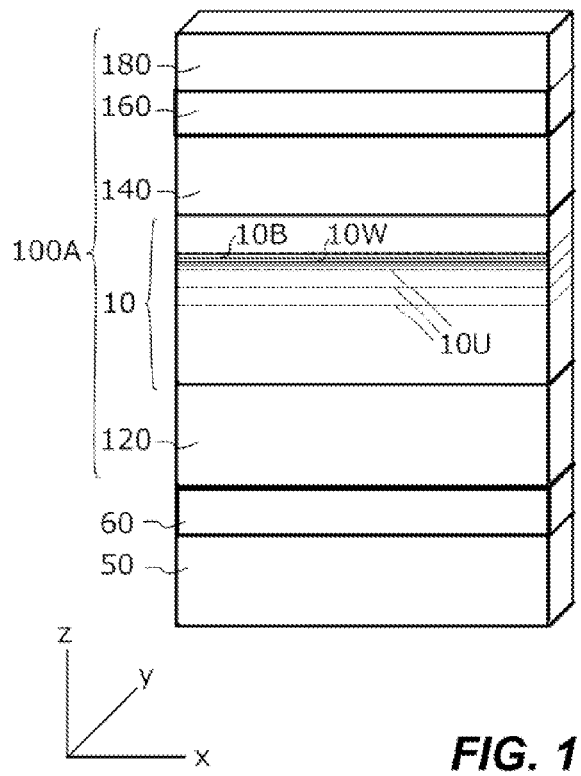
Figure 1:
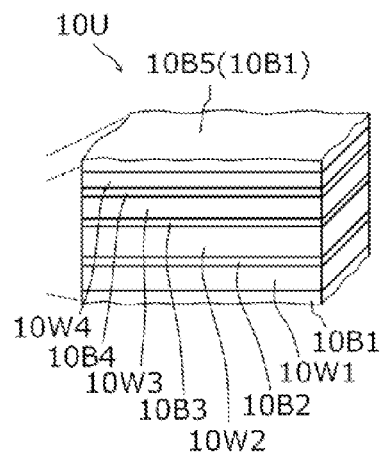

Embodiments of the present invention will be described. For all drawings, the common reference signs are given to common parts or elements unless otherwise noted. Moreover, each element in the drawing should be understood as not being drawn to scale.

1. Operation and Improvements of THz-QCL Elements

In the first place, what will be described are operation mechanisms in quantum cascade laser elements (THz-QCL elements) of LO-phonon assist type that emit electromagnetic waves in THz range, and principles for their improvements in the present embodiment.

1-1. Operation Mechanisms of THz-QCLs

FIG. 1 is a perspective view (FIG. 1a), an enlarged cross sectional view (FIG. 1b), and a further enlarged partial cross sectional view (FIG. 1c), showing general structure of a THz- QCL element 1000 in the present embodiment. A typical THz-QCL element 1000 (FIG. 1*a*) is generally equipped with a pair of electrodes 20 and 30 and a QCL structure 100 that is a semiconductor superlattice formed therebetween. The electrodes 20 and 30 are used for receiving an electric voltage for producing an electric field in the QCL structure 1000 and an electric current for emission, or luminescence. The electrodes 20 and 30 also have an effect of light confinement that is realized by the cavity structure with the help of surface plasmon. The QCL structure 100 includes active region 10. The THz-QCL element 1000 can operate in such a way that electromagnetic waves 2000 of THz range is emitted by transition of electrons from one subband to another subband located below in energy, where both subbands are formed in the active region 10 when an electric voltage is applied between the pair of electrodes 20 and 30. The electrode 30 is formed on receptor substrate 40 (hereinafter referred to as "receptor 40") in the THz-QCL element 1000 in FIG. 1.

For the purpose of the operation mentioned above, the active region 10 (FIG. 1*b*) has unit structures 10U that are provided in a layered manner along the thickness direction, where each unit structure 10U has alternatingly stacked sets of a well layer 10W and a barrier layer 10B. The well layers 10W consist of $Al_xGa_{1-x}As$ (where $0<x<1$), whereas the barrier layers 10B, in the present embodiment, consist of $Al_yGa_{1-y}As$ (where $x<y\leq1$), which is a mixed crystal of AlAs and GaAs. Because of the setting $x<y$, potentials formed by the conduction band of barrier layers 10B create potential barriers for the conduction band in well layers 10W. It should be noted that each unit structure 10U has a plurality of such well layers 10W and a plurality of such barrier layers 10B. Accordingly, when each of barrier layers 10B is to be identified as necessity, they may be distinguished as barrier layers 10B1-10B5 in this order from the substrate 50. Similarly, the well layers 10W may be distinguished as well layers 10W1-10W4.

The QCL structure 100 (FIG. 1*a*) is formed by trimming off the extended periphery portion from layered structure for the semiconductor superlattice 100A. In the semiconductor superlattice 100A, an etch stop layer 60 ("ES layer 60") is formed on GaAs substrate 50 having surface orientation (001) (hereinafter, "substrate 50") by disposing AlGaAs with 600 nm thickness. Details for the ES layer 60 will be described later. Then, a highly doped n-type GaAs layer 120 (electron density ~$3\times10^{18}$ $cm^3$) is formed with 800 nm thickness on the surface of the ES layer 60; thereafter, an active region 10 is formed. On the surface of the formed active region 10, a highly doped n-type GaAs layer 140 (electron density ~$3\times10^{18}$ $cm^3$) is formed with 50 nm thickness. Then a delta-dope GaAs layer 160 consisting of ten sets of 1 nm thick GaAs layer and a delta-dope layer of Si is formed; and lastly, a low temperature grown GaAs layer (LTG—GaAs layer) 180 is formed with 5 nm thickness. It should be noted that FIG. 1*b* indicates the stacked film structure formed on one surface of a substrate 50 in the order of the stacking process, from the bottom to the top in the drawing. The semiconductor superlattice 100A in FIG. 1*b* is indicated in upside down view of the QCL structure 100 in FIG. 1*a*.

In the conventional THz-QCL elements, not shown, the active region 10 of the QCL structure 100 is fabricated such that the well layers 10W are made of GaAs, and the barrier layers 10B are made of $Al_xGa_{1-x}As$ (x is 0.15, 0.20, or the like). See for example, Patent Document 1, column 31. In contrast, the THz-QCL element 1000 in the present embodiment is fabricated in such a manner that, with the addition of Al also to the well layers 10W, the well layers 10W are made of $Al_xGa_{1-x}As$ ($0<x<1$), and the barrier layers 10B are made of $Al_yGa_{1-y}As$ ($x<y\leq1$).

In the semiconductor superlattice 100A in FIG. 1*b*, the unit structures 10U are formed in a layered manner of, such as, 10-200 stacks in the active region 10. FIG. 1*c* indicates with enlarged view the structure of one unit, or one period, for each unit structure 10U. The unit structure 10U has the barrier layers 10B and well layers 10W alternatingly layered with each other. Since each barrier layer 10B and each well layer 10W are stacked alternatingly, the well layer 10W1 is disposed directly on the barrier layer 10B1, and the barrier layer 10B2 is disposed directly on the well layer 10W1. The rest is the same as the above. It should be noted that the barrier layer 10B5 is corresponding to barrier layer 10B1 in a unit structure 10U in the next period.

Figure 2:
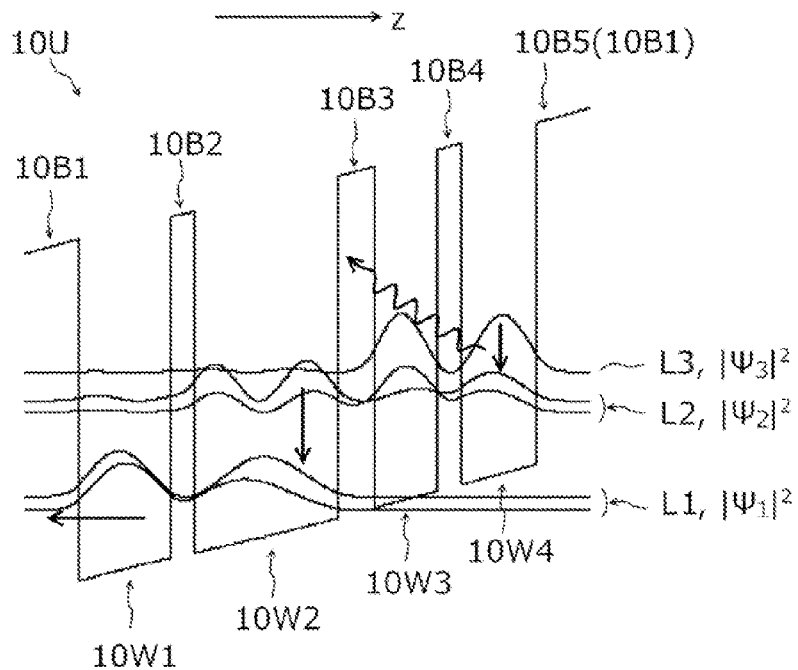
FIG. 2 is a schematic diagram for illustrating a potential for electrons and subbands of electrons in a unit structure of a QCL structure formed in a THz-QCL element for an embodiment of the present invention.
Figure 2:
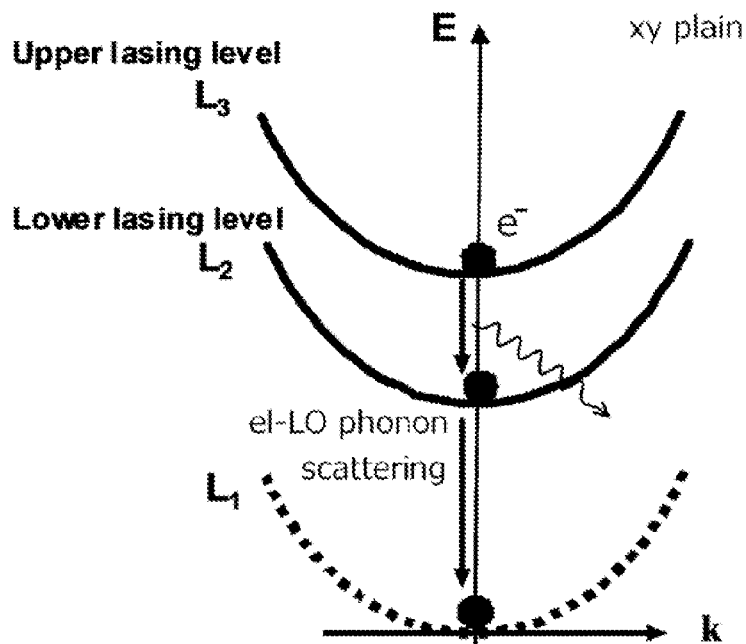

FIG. 2 is a schematic diagram for illustrating a potential for electrons and subbands of electrons in the unit structure 10U of the QCL structure 100 formed in the THz-QCL element 1000. FIG. 2*a* shows a variation of potential for electrons in z-axis direction. The potential is generally inclined due to the voltage for operation applied to the THz-QCL element 1000. Reference signs corresponding to respective layers in the unit structure 10U are indicated in FIG. 1*c* for respective protrusion and recess portions of the potential. Moreover, FIG. 2*b* is a schematic diagram of a dispersion relationship, which indicates energy levels of electrons in the unit structure 10U with reference to a wave number (k) space in the xy plane (FIG. 1).

FIG. 2*a* depicts, in addition to the potential, five curves for $|\Psi|^2$, which is squared amplitude of z dependent factor of a three dimensional wave function $\Psi$ for an electron. Each curve shows relative values of probability of finding an electron at each position along z-axis obtained by conducting self-consistent calculation. The depicted five curves are: a curve $|\Psi_3|^2$ corresponding to the level L3, and curves $|\Psi_2|^2$ and curves $|\Psi_1|^2$ corresponding respectively to levels L2 and L1. Two curves are indicated for each of levels L2 and L1 because there are two wave functions with degenerated energy values for each. In this respect, electrons in levels L1-L3 have energy dispersion relationships as indicated in FIG. 2*b*, for their wave number (k) space in plane with the xy plane (FIG. 1). The levels L3 and L2 are the upper and lower lasing levels respectively, whereas the level L1 is the depopulation level. It should be noted that vertical positions of curves $|\Psi_3|^2$, $|\Psi_2|^2$, and $|\Psi_1|^2$ on the drawing are depicted in such a manner that each axis for denoting $|\Psi|^2=0$ (or baseline for each curve, not shown) reflects corresponding energy eigen value at $k_x=k_y=0$ in FIG. 2*b*, or a minimum value of energy for corresponding level.

The THz-QCL element 1000 provided with the QCL structure 100 having the structure and the potential profile mentioned above operates as follows. In each unit structure 10U, electromagnetic waves in THz range are emitted by stimulated emission, when electrons make transition from the upper lasing level or the level L3, to the lower lasing level or the level L2. The electromagnetic waves are indicated by a wavy arrow in FIG. 2. To form the population inversion for lasing, the details in the structure of the unit structure 10U, or thicknesses and orders for respective layers as well as the value of the potential, are designed such that electrons in the level L2 can be efficiently depopulated to the level L1.

To give an explanation of the emission process by focusing on the electron's action, the electron makes transition from the level L3 to the level L2, where both levels have significant probability of finding an electron in the well layer 10W4 or 10W3. During the transition, electrons couple to the optical field there and emit electromagnetic waves, or making nonradiative transition. The level L2, which is the level of the electron after transition, has significant probability of finding electron also in the well layer 10W2. Therefore, an electron at the level L2 may tunnel through the barrier 10B3. The electron at the level L2 experiences electron-phonon scattering with LO-phonons and makes transition to the level L1 mainly within the well layer 10W2. Then, the electron at the level L1 is injected to level L3, not shown, of a unit structure 10U located the next position in a negative z-axis direction. Thus, the areas of the well layers 10W4 and 10W3 may be considered as emission areas where electromagnetic waves are radiated. Also, the well layer 10W2 acts as a phonon well layer where depopulation of electrons is enhanced by use of LO-phonon scattering from the electron distribution at the level L2. Moreover, the well layer 10W1 acts as an injection well layer, which is an injection area for electrons in the level L1 toward a unit structure 10U in the next stage.

1-2. Concept of Improvement

The inventors have analyzed mechanisms governing the threshold current density $J_{th}$ and the maximum operating temperature $T_{max}$ in THz-QCLs of LO-phonon assist type, and have found that, in addition to the depopulation effect of electrons from the level L2 to the level L1, other effects by LO-phonons are brought about. Specifically, the maximum operating temperature $T_{max}$ and the threshold current density $J_{th}$ are influenced by the following two effects.

Figure 3:
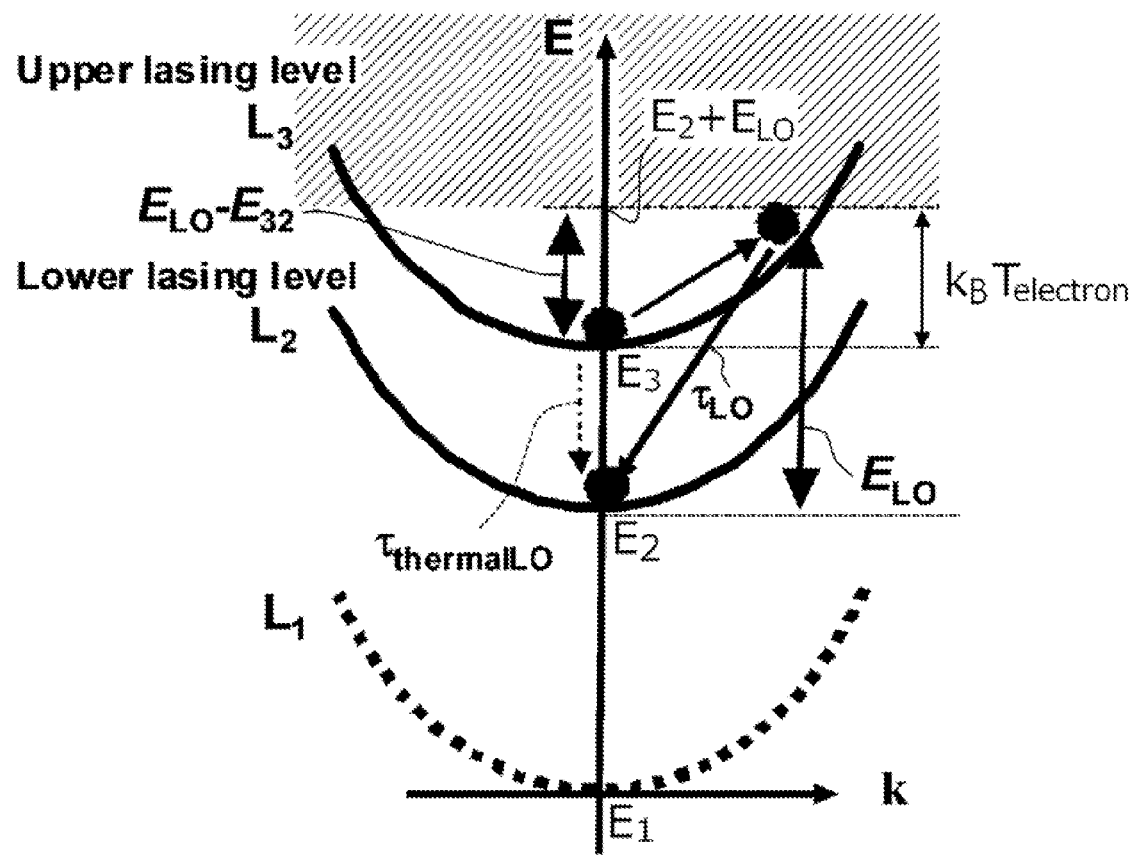
FIG. 3 is a schematic diagram for illustrating phonon mediated leak of thermally excited electrons in an embodiment of the present invention.

One is a mechanism called phonon mediated leak of thermally excited electrons. FIG. 3 is a schematic diagram illustrating the phonon mediated leak of thermally excited electrons. FIG. 3 depicts a chart of electronic energy levels in the unit structure 10U similarly indicated as in FIG. 2b. To realize lasing with minimum electric current or in maximum temperature setting, it is preferable as indicated in FIG. 3 that electromagnetic wave emissions with transition to the level L2 should be contributed by as many electrons in the level L3, which is the upper lasing level, as possible. However, in the actual situation, another transition mechanism related to LO-phonons causes a nonradiative transition, in which electrons make transition from the level L3 to the level L2 without emission at all. This nonradiative transition is associated with electrons that are thermally excited to have higher energy than a certain level out of all the electrons in the level L3. Due to the thermal excitation, the electron in the level L3 in FIG. 3 also moves in xy plane with non-zero wave number k, thus it is possible that the electron may have an energy value higher than the minimum energy $E_3$ by amount of its kinetic energy. The degree of such thermal excitation is expressed as $k_B T_{electron}$, where $T_{electron}$ denotes electronic temperature, and $k_B$ denotes Boltzmann constant. As an example value, $k_B T_{electron}$ is around 8.6 meV in the case of the $T_{electron}$ is 100 K. In such a case, the difference $E_{32}$ between the minimum energy $E_3$ of the level L3 and the minimum energy E2 of the level L2 corresponding to a photon energy of the emitted electromagnetic wave is around 15 meV as an example. The LO-phonon energy $E_{LO}$ for a substance with a composition of almost entirely GaAs is around 36 meV. Therefore, in the course of the operation, there will be a large number of electrons in the level L3 having energy value of the same or higher than an energy value of $E_2+E_{LO}$ that is higher than the baseline indicating the minimum energy $E_2$ of the level L2 by an amount of energy $E_{LO}$, the LO-phonon energy, which are indicated by hatching in the drawing. Moreover, the number of such electrons will increase according to the electronic temperature $T_{electron}$.

Furthermore, electrons exceeding $E_2+E_{LO}$ interact with LO-phonon and relax to the level L2 without emission with extremely high rate (nonradiative transition). This is caused due to the nature of LO-phonons. When such nonradiative transition prevails, the population inversion formed between the level L3 and level L2 due to the depopulation of electrons will be cancelled, and lasing will be impeded. This phenomenon of nonradiative transition of thermally excited electrons due to the LO-phonon is the phonon mediated leak of the thermally excited electrons. That is, the phonon mediated leak of the thermally excited electrons is a mechanism through which thermally excited electrons in the level L3 make nonradiative transition or "leak", without making optical transition.

Figure 4:
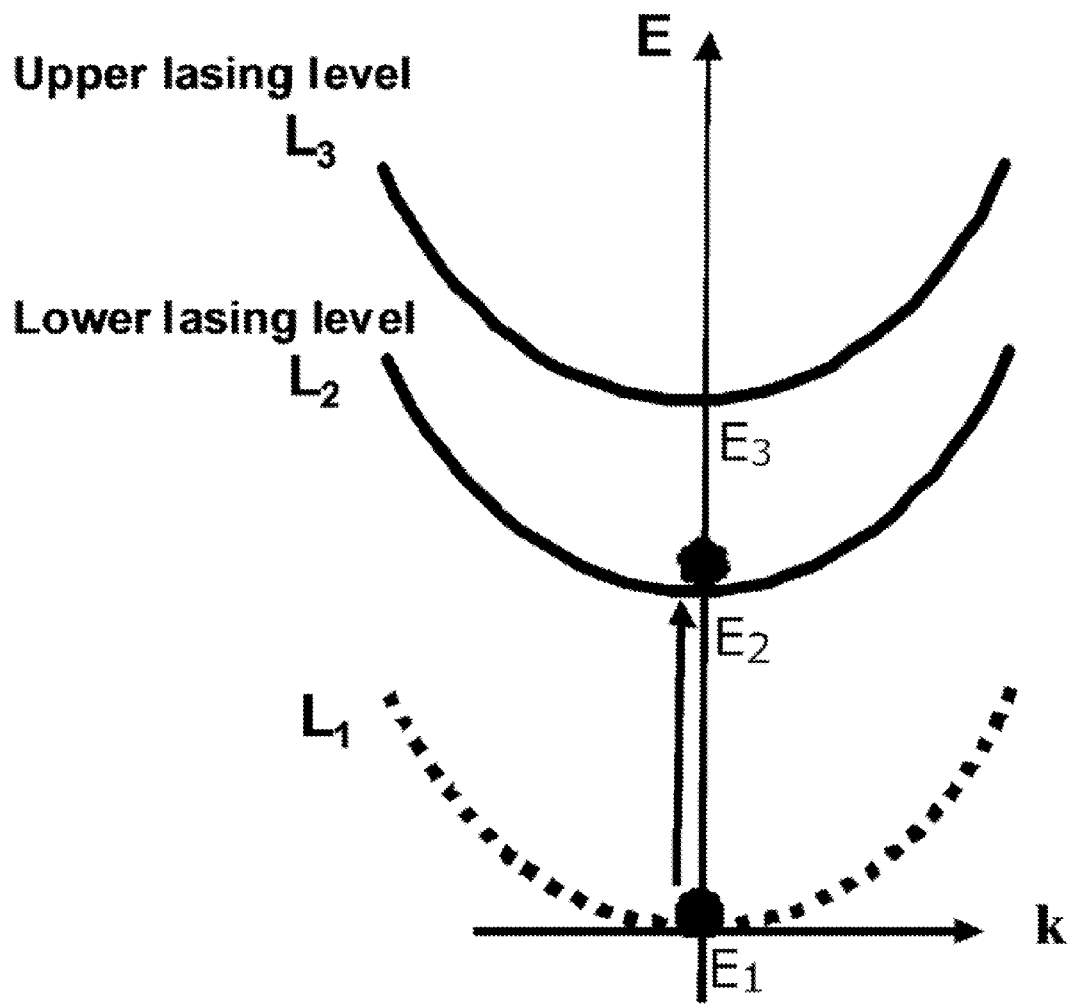
FIG. 4 is a schematic diagram for illustrating thermal back-filling in an embodiment of the present invention.

The other effect of LO-phonons is one in which electrons are thermostatistically excited from the level L1 to the level L2, and such electrons cancel the population inversion. This phenomenon is called thermal backfilling. FIG. 4 is a schematic diagram illustrating the thermal back-filling. This mechanism reflects the fact that electrons depopulated from the level L2 to the level L1 probabilistically include electrons having more energy than energy difference $E_{21}$, which is a difference value between the minimum energy values $E_2$ and $E_1$ of the levels L2 and L1 respectively. The energy difference $E_{21}$ is set almost the same as, or slightly smaller (such as, by 1 meV or less) than the energy $E_{LO}$, in consideration of the mechanism of the depopulation of electrons by the LO-phonon.

1-2-1. Suppression of Phonon Mediated Leak of Thermally Excited Electrons

To suppress the phonon mediated leak of the thermally excited electrons, the inventors of the present application have paid attention on modification of materials of the QCL structure 100 for changing the value of the LO-phonon energy $E_{LO}$. More specifically, the material of the QCL structure 100 is selected in such a way that the following expression is satisfied:

$$E_{LO} > k_B T + E_{32},$$

when an electric voltage is applied for emission operation of electromagnetic waves. In this expression, $E_{LO}$ denotes energy of an LO-phonon that can be excited within the semiconductor superlattice 100, $E_{32}$ denotes a difference value between the minimum energy $E_3$ of the upper lasing level and the minimum energy $E_2$ of a lower lasing level, or $E_3-E_2$, and T denotes operating temperature (unit: K).

More preferably, the materials of the QCL structure 100 is selected to satisfy the following expression:

$$E_{LO} > k_B T_{electron} + E_{32}.$$

In this expression, $T_{electron}$ denotes electronic temperature (unit: K). In these material selections, the probability of mediation, with which the electrons thermally excited in the level L3 or the upper lasing level make the nonradiative transition from the level L3 to the level L2 or the lower lasing level, is reduced. In this regard, the probability for the electron of leaking from the level L3 to the level L2 with the nonradiative transition is further reduced according to increase of the value of LO-phonon energy $E_{LO}$. Moreover, when the value of the $E_{LO}$ is increased, the leak through the nonradiative transition is prevented even for greater $k_B T_{electron}$ value as an indication of the thermal excitation. Consequently, if the value of $E_{LO}$ is increased, the maximum operating temperature $T_{max}$ of the above-mentioned QCL will be raised.

It should be noted that the electronic temperature $T_{electron}$ is higher than the operating temperature T by around 10-20 K or the like. This is because, in laser elements in pulse operation or continuous operation, supplied electric energy is transmitted first to electrons, and the thermal energy of the electrons are then transferred, or dissipated, to heat sink or so. Since the electronic temperature $T_{electron}$ becomes higher than the operating temperature T, which can be measured from outside, the $E_{LO}$ is determined by a comparison with the operating temperature T, and more preferably determined by a comparison with the electronic temperature $T_{electron}$.

1-2-2. Suppression of Thermal Backfilling

Merely increasing the value of LO-phonon energy $E_{LO}$ as described above does not have any specific impact on the thermal backfilling. This is because the LO-phonon energy $E_{LO}$ does not have direct influence on the electrons excited from the level L1 to the level L2. However, the influence of the thermal backfilling can be reduced when the energy difference $E_{21}$ between the minimum energy for the level L2 and one for the level L1 is maintained such that these minimum energy values satisfy a condition for favorably practicing the depopulation of electrons with the LO-phonon energy $E_{LO}$ from the level L2 to the level L1. Specifically, since the thermal backfilling is caused by thermal excitation of electrons from the level L1 to the level L2, modifying the design of the QCL structure 100 to have increased $E_{21}$ in response to the increase of $E_{LO}$ will also lead to reduction of the thermal backfilling.

1-3. Detailed Improvement

To reflect the concepts of the improvements in the present embodiment described above, the materials making the active region 10 in the QCL structure 100 are modified from those adopted before, as a solution of increasing the LO-phonon energy $E_{LO}$. Also, the design of the QCL structure 100 is modified or adjusted accordingly.

1-3-1. Modification of Materials

A specific solution of the present embodiment is to increase aluminum (Al) in the active region 10 to increase the energy $E_{LO}$. That is, to increase the LO-phonon energy $E_{LO}$, Al is increased for the combination of GaAs only composition (for conventional well layer) and $Al_{0.15}Ga_{0.85}As$ or similar composition (for conventional barrier layer), where $Al_{0.15}Ga_{0.85}As$ is a composition of mixed crystal of GaAs and AlAs containing 0.15 of Al in atomic ratio. The LO-phonon energy for GaAs is about 36 meV, and the LO-phonon energy for $GaAs/Al_{0.15}Ga_{0.85}As$ in the (conventional well layer)/(conventional barrier layer) composition is also about 36 meV. In contrast, the LO-phonon energy for AlAs is about 44 meV. Moreover, in the active region 10, Al content is increased in the barrier layers 10B and in the well layers 10W too. In particular, providing aluminum Al into the well layers 10W is effective, because the well layers 10W occupy greater fraction in the unit structure 10U as shown in FIG. 2a, and the provision of aluminum Al to the well layers 10W makes it possible to set the LO-phonon energy closer to ~44 meV. Therefore, in the active region 10 of the THz-QCL element 1000 in the present embodiment, by introducing aluminum Al to the well layers 10W in particular, the LO-phonon energy is increased than before.

1-3-2. Modification of Design

Figure 5:
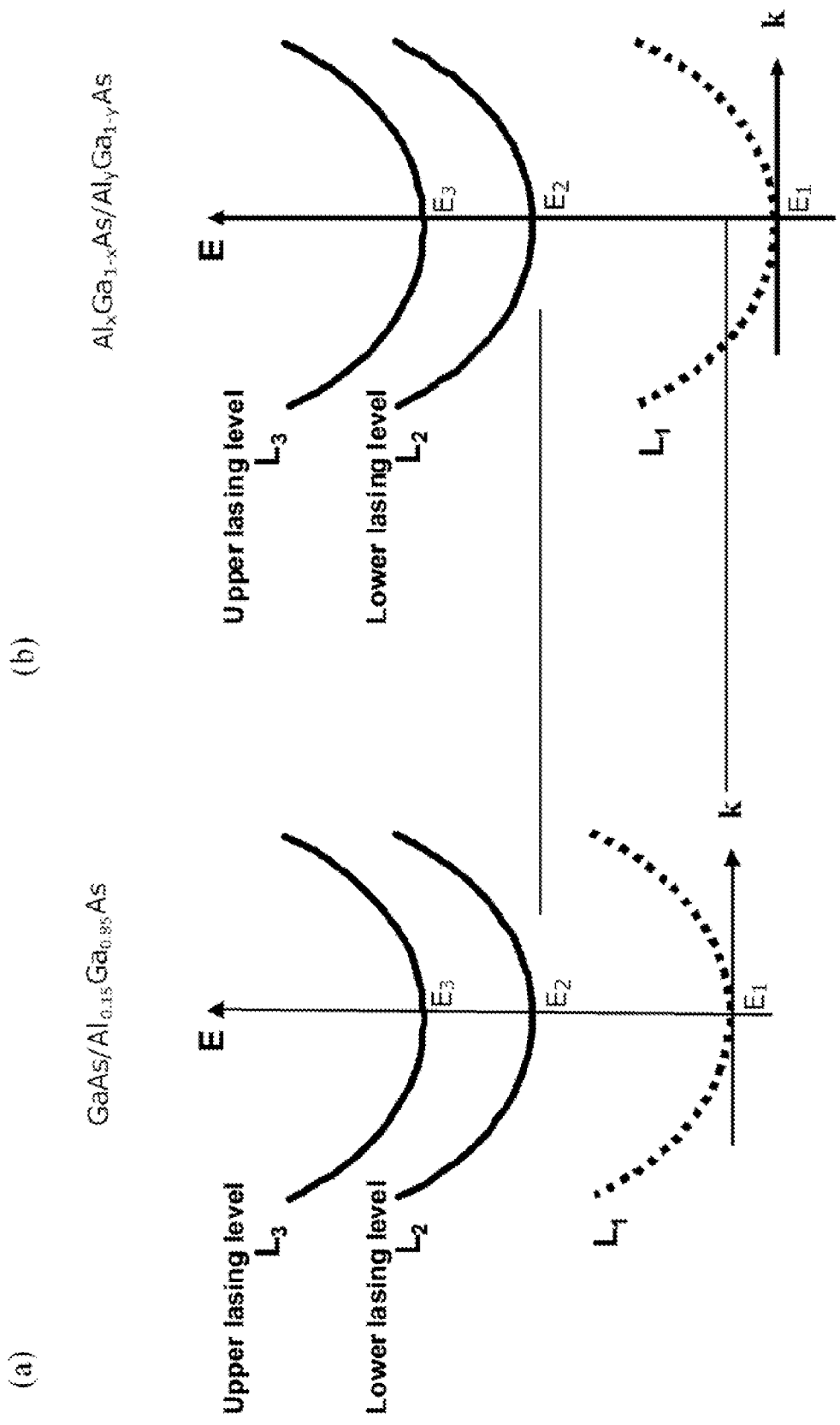
FIG. 5 is a schematic diagram of energy dispersion relationships in xy plane.

In the THz-QCL element 1000 in the present embodiment, in addition to increasing Al in the active region 10, its design is also modified or adjusted from that in conventional one. FIG. 5 is a schematic diagram of energy dispersion relationships in xy plane. FIG. 5a depicts an energy dispersion relationship for conventional design, whereas FIG. 5b depicts one for the present embodiment. Although such details as effective mass of electron in each level may be varied according to the modification of materials, they are not reflected in the drawings. As can be seen from the comparison of FIG. 5b with FIG. 5a, the design will be changed in the THz-QCL element 1000 to have expanded difference between the levels L2 and L1 in response to the increased energy $E_{LO}$ for the material modification.

That is, the probability of the depopulation from the level L2 into the level L1 is set increased is increased to implement population inversion necessary for the laser oscillation. Typically, the QCL structure 100 is configured in such a manner that the difference $E_{21}$ between the minimum energy values $E_2$ and $E_1$ for the levels L2 and L1 satisfies, when a voltage is applied, a relationship $$E_{LO} \gtrsim E_{21}$$

with relative to the LO-phonon energy $E_{LO}$. In the case of conventional THz-QCLs, not shown, ELO is about 36 meV or so, which is the value for GaAs. The depopulation of electron from the level L2 by the LO-phonon is achieved through its function to cause transition of electrons occupying the level L2 to the level L1 as quickly as possible. Also, for the THz-QCL element 1000 of the present embodiment, the design of the semiconductor superlattice 100A is modified or adjusted for this purpose, in such a manner that the energy difference $E_{21}$ between the levels L2 and L1 is identical to, or is slightly greater smaller than the phonon energy $E_{LO}$ in the QCL structure 100.

Figure 6:
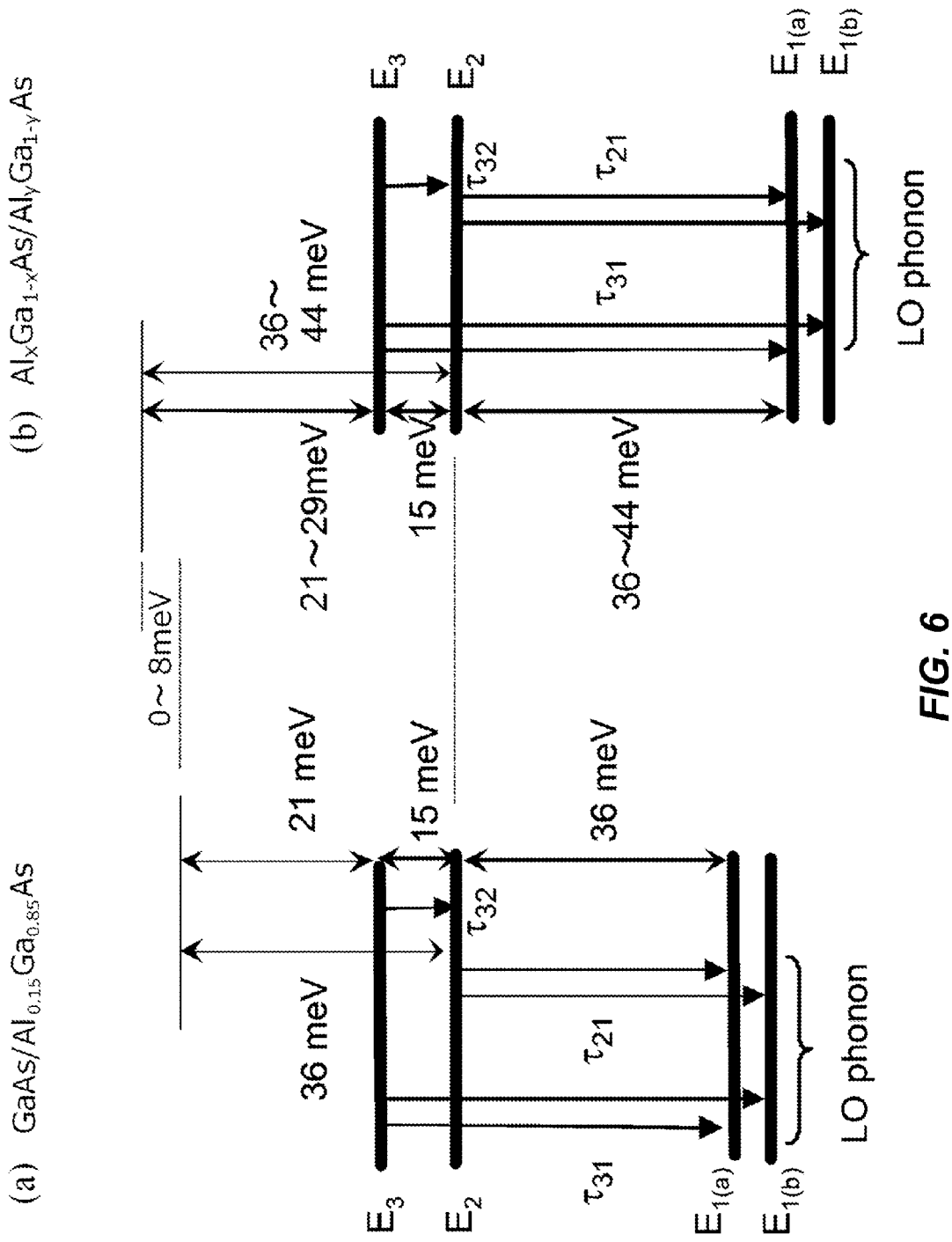
FIG. 6 is an energy chart for illustrating relaxation mechanisms of electrons.

Further description will be made in this respect with reference to FIG. 6. FIG. 6 is an energy chart for illustrating relaxation mechanisms of the electrons. FIG. 6a depicts a case when the well/barrier layers have compositions of $GaAs/Al_{0.15}Ga_{0.85}As$, assuming the energy $E_{LO}$ is about 36 meV; whereas FIG. 6b depicts a case when the well/barrier layers have compositions of $Al_xGa_{1-x}As/Al_yGa_{1-y}As$ (x<y≤1), assuming the energy $E_{LO}$ is about 44 meV. The energy $E_{LO}$ may vary for example from ~36 meV to ~44 meV in response to values specified for the above-mentioned x and y. The minimum energy $E_1$ of the level L1 refers to an energy value for two degenerated levels as indicated in FIG. 2a. Also, indications of lifetime for the transitions are placed between the levels where the transitions take place. The illustration is indicated for a case when energy of 15 meV, corresponding to photon energy of 3.6 THz electromagnetic wave, is provided between the levels L3 and L2. For the purpose of explanation, $E_{21}$, or $E_2-E_1$ is assumed to be identical to $E_{LO}$.

When the well/barrier layers have compositions of $GaAs/Al_{0.15}Ga_{0.85}As$ as indicated in FIG. 6a, electrons having 21 meV higher energy than the minimum energy $E_3$ of the level L3, i.e., electrons thermally excited to an extent that associated electronic temperature $T_{electron}$ reaches around 240 K, mostly make nonradiative transition to the level L2. In other words, the margin to upper boundary of an energy range over which electrons can be distributed is 21 meV above the $E_3$. In contrast, for $Al_xGa_{1-x}As/Al_yGa_{1-y}As$ (x<y≤1) as indicated in FIG. 6b, the upper limit mentioned above is located 29 meV above the minimum energy $E_3$ of the level L3, which expands the margin to upper boundary available for the electronic temperature $T_{electron}$ by about 8 meV, or 90 K for the energy $E_{LO}$ of 44 meV. Even though GaAs is not entirely replaced by AlAs, addition of Al to GaAs provides additional margin against the phonon mediated leak for the thermally excited electrons. This is a countermeasure against the phonon mediated leak of the thermally excited electrons.

On top of that, the effect of the thermal backfilling is also alleviated by introducing Al to GaAs for modifying or adjusting the design of the semiconductor superstructure 100A. Assuming that $E_{21}=E_{LO}$ is satisfied and that the electronic temperature $T_{electron}$ is 200 K, if the energy $E_{LO}$ is 36 meV, around 11% of electrons in the level L1 make transition to the level L2 with thermal excitation. In contrast, for energy $E_{LO}$ of 44 meV, the fraction of electrons in the level L1 that will make transition to the level of L2 is reduced to around 7.3%. It follows that, according to the shift of the $E_{LO}$ from 36 meV to 44 meV, the number of electrons in the level L2 relating to the thermal backfilling becomes 1/1.5 as many electrons as before, which makes it easier to generate population inversion.

Furthermore, our acquired knowledge includes the fact that scattering probability of the thermally excited electrons by LO-phonons is not increased even when the material composition was modified for the purpose of the increasing the LO-phonon energy. That is, in the case the scattering probability increases according to the above-mentioned material modification, usually the possibility of reduction of $\tau_{32}$ should be taken into account. However, the inventors of the present application have confirmed that such increase of scattering probability per se does not happen at al.

It should be noted that there is no limitation on specific solutions for implementing the design modification indicated with reference to FIGS. 5b and 6b. The design can be modified, for example, by adjusting voltages applied for operation, and by adjusting thicknesses for the well layers 10W and the barrier layers 10B.

1-4. Practical Calculation Example

The inventors of the present application assessed though theoretical calculation as to whether the maximum operating temperature $T_{max}$ is increased as intended or not, and as to whether threshold current density $J_{th}$ is reduced or not, after modifications of the materials and the design, mentioned above.

1-4-1. Simulation on Material Modification Effect

Parameters used for the rate equation have relationship with $J_{th}$ as follows:

$$J_{th} = \frac{\varepsilon_0 n}{4\pi e} \frac{L}{\Gamma} \frac{\lambda(2\gamma_{32})}{(Z_{32})^2} \frac{\alpha_w + \alpha_M}{\tau_3(1 - \tau_2/\tau_{32})} \propto \frac{2\gamma_{32}}{\tau_3(1 - \tau_2/\tau_{32})} \qquad \text{Formula 1}$$

Here, $\varepsilon_0$ is the dielectric constant of vacuum, e is charge of an electron, $\Gamma$ is an optical confinement factor, $Z_{32}$ is a dipole matrix element between the levels L3 and L2, $\lambda$ is a wavelength of the electromagnetic wave in vacuum, n is a refractive index for the electromagnetic wave with wavelength $\lambda$, L is a thickness of the unit structure 10U, $\alpha_w$ is a loss of mirror, $\alpha_M$ is a loss of cavity, $\gamma_{32}$ is a line width, or full width at half maximum, for laser transition between the levels L3 and L2, $\tau_3$ is a lifetime of electron in the level L3, $\tau_2$ is a lifetime of electron in the level L2, and $\tau_{32}$ is a lifetime for electron in the level L3 to transition to the level L2 through intersubband transition.

For the $\tau_{32}$ found in the expression of the threshold current density $J_{th}$ in Formula 1, the following relationship holds.

$$1/\tau_{32} = (1/\tau_{e-e}) + 1/\tau_{thermalLO} \qquad \text{Formula 2}$$

Here, $\tau_{e-e}$ is a time constant of electron-electron scattering, or average lifetime, which will be referred to as "scattering time", $\tau_{thermalLO}$ is a scattering time of the phonon mediated leak for thermally excited electrons. For materials in which Al is introduced into GaAs, since the $\tau_{e-e}$ is long enough to be neglected while the $\tau_{thermalLO}$ is short, the lifetime from the level L3 to the level L2 is determined by the $\tau_{thermalLO}$ of the phonon mediated leak for thermally excited electrons. The $\tau_{thermalLO}$ is given as follows.

$$\tau_{thermalLO} \approx \tau_{LO} \exp((E_{LO} - E_{32})/k_B T_{electron}) \qquad \text{Formula 3}$$

Here, $\tau_{LO}$ is a scattering time of LO-phonon scattering for electrons having kinetic energy of $E_{LO}$-$E_{32}$. The $\tau_{electron}$ and $\tau_{LO}$ are fitting parameters to be determined such that the theoretical curve explains experimental results.

Based on the relationship of Formula 2, in addition to the $\tau_{32}$, temperature dependences of $\tau_{31}$, which is a lifetime of electrons in the level L3 to the level L1, and of $\tau_2$ may be crucial. Regarding these temperature dependences, since the LO-phonons obey Bose-Einstein statistics, the following relationship holds.

$$1/\tau_{31}, 1/\tau_2 \propto \frac{1}{e^{\hbar\omega_{LO}/k_B T_{lattice}} - 1} + 1 \qquad \text{Formula 4}$$

Here, h(h-bar) is a Planck constant h divided by $2\pi$, $\omega_{LO}$ is an angular frequency of LO-phonon. $T_{lattice}$ is lattice temperature of the crystal. $E_{LO}$ is energy of LO-phonon and is equivalent to $\hbar \times \omega_{LO}$. The lattice temperature $T_{lattice}$ is set to identical value to the heat sink temperature.

The maximum current density $J_{max}$ flowing through the THz-QCL element 1000 is determined by the following relationship.

$$J_{max} = \frac{nq}{2\tau_3} \qquad \text{Formula 5}$$

Here, n is a density of carrier (electron), q is electric charge of the carrier (electron), which is identical to the elementary charge e. Theoretically, the maximum operating temperature $T_{max}$ is obtained from a range that has nonnegative $J_{max}$-$_{th}$. That is, the THz-QCL element 1000 can operate only when the threshold current density $J_{th}$, which is susceptible to the temperature, does not exceed a maximum current density $J_{max}$ that is allowed to flow during lasing operation.

Simulation on the effect of material modification is conducted through the theoretical calculation based on these relation formulas as in the following steps. In the first step, relaxation times $\tau$ ($\tau_{31}$, $\tau_{21}$) are calculated under low temperature condition. In doing so, electron-electron scattering is neglected. Then the $\tau_{LO}$ and the $\tau_{electron}$ in the $\tau_{thermalLO}$ are determined to fit experimental results. Next, in the second step, temperature dependencies for all relaxation times $\tau$ ($\tau_{31}$, $\tau_{21}$, $\tau_{LO}$) are determined, and the threshold current densities $J_{th}$ for respective temperature values are numerically calculated. The threshold current densities $J_{th}$ generally have a tendency to increase according to increase of the temperature. Then, in the third step, temperature $T_{max}$ is determined in such a manner that the threshold current density $J_{th}$ therefrom matches the maximum value $J_{max}$ of the current density. More details have been disclosed by a part of the inventors of this application (Non-Patent Document 3: T. T. Lin, K. Ohtani, and H. Ohno, Applied Physics Express, No. 2, 022102 (2009)).

1-4-2. Prospects by Theoretical Calculation

Figure 7:
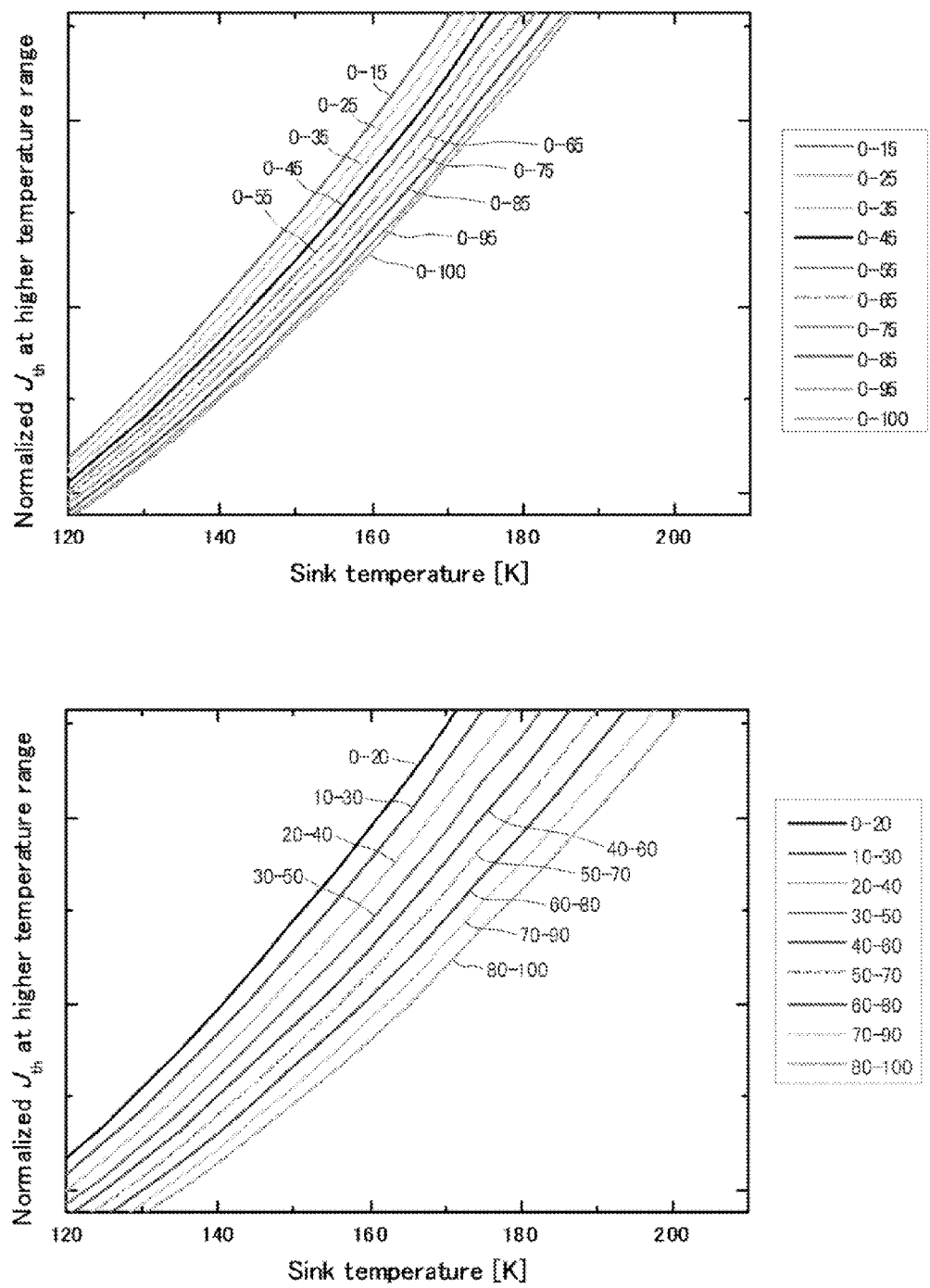
FIG. 7 is a detailed graph of numerical calculation prospects on threshold current density $J_{th}$ while composition of an active region is changed.
Figure 8:
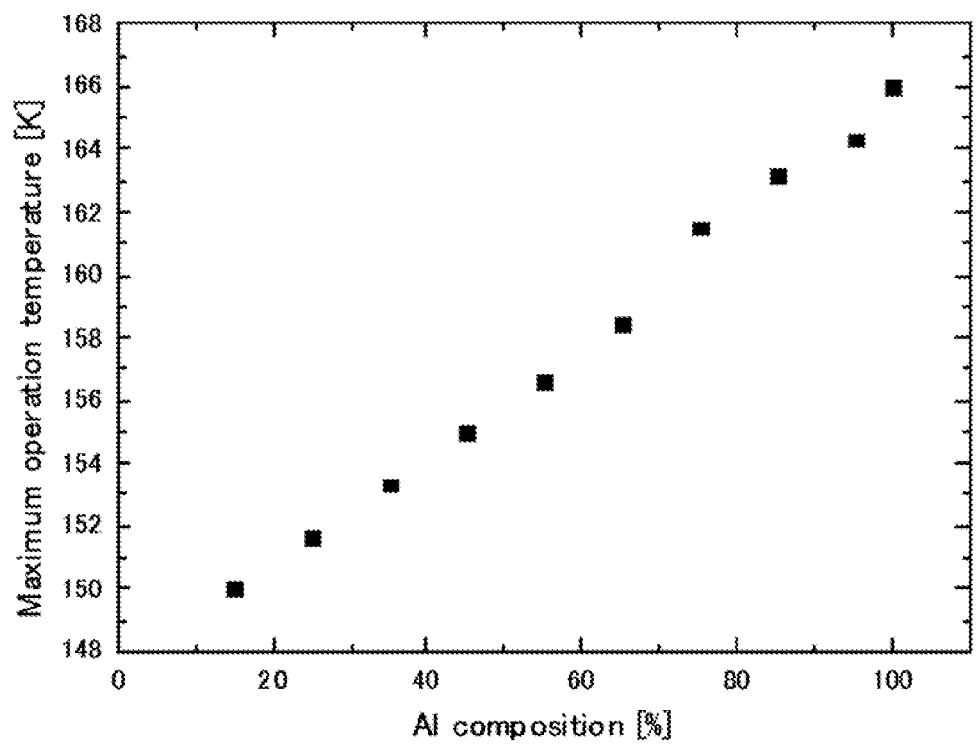
FIG. 8 is a graph showing composition dependency of maximum operating temperature $T_{max}$ read from the numerical calculation prospects in an embodiment of the present invention.
Figure 8:
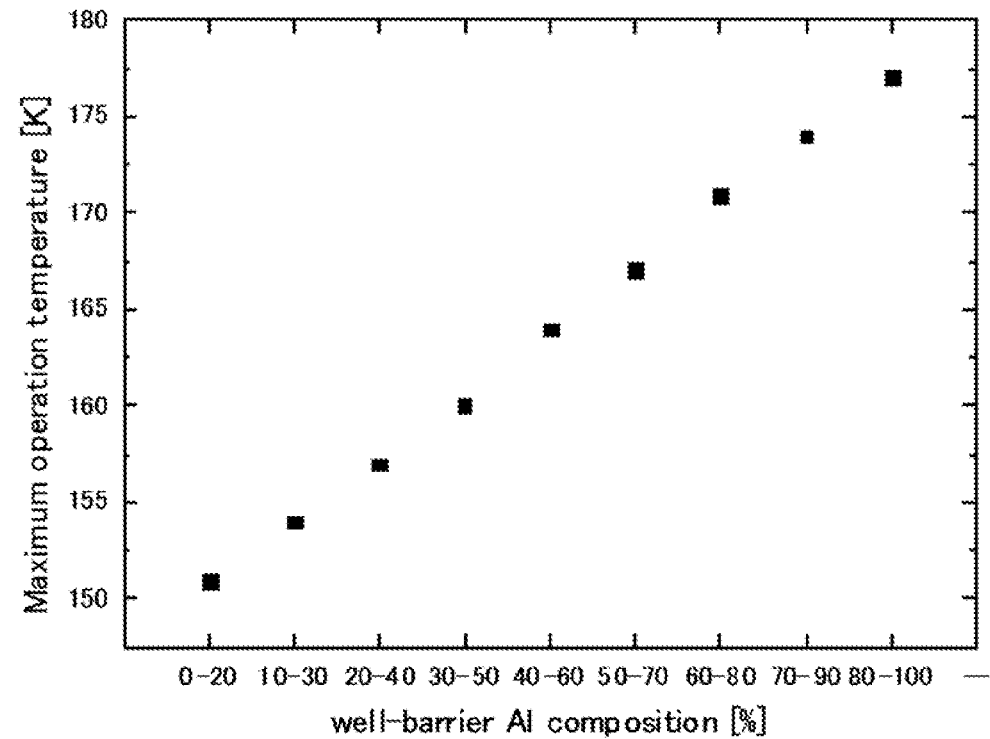

Next, calculated prospects of lasing operation based on rate equations are described. The numerical calculation has been carried out for threshold current density $J_{th}$ with each temperature in respect of material modifications for cases (1) when Al is added to the barrier layers only, and (2) when Al is added to both the well and barrier layers. This is because, once the threshold current density $J_{th}$ is obtained for each temperature, not only the composition dependence in the threshold current density $J_{th}$ but also knowledge of the maximum operating temperature $T_{max}$ will be obtained. FIG. 7 is a detailed graph of numerical calculation prospects of threshold current density $J_{th}$ when composition of an active region 10 is shifted. When the modified composition of the active region 10 is indicated by the (well layers 10W)/(barrier layers 10B) compositions, FIG. 7a shows cases when Al content x is changed for x=0.15-0.95 with 0.1 increment, as well as x=1, for GaAs/Al$_x$Ga$_{1-x}$As; whereas FIG. 7b shows cases when Al content x is changed for x=0.2-0.8 with 0.1 increment, while keeping y=x+0.2, in Al$_x$Ga$_{1-x}$As/Al$_y$Ga$_{1-y}$As. For each graph, legend labels are indicated as (atomic % of Al in the well layers)–(atomic % of Al in the barrier layers). The horizontal axes of FIGS. 7a and 7b indicate the heat sink temperature, and the vertical axes indicate normalized threshold current density $J_{th}$ in high temperature range, where the normalization was carried out such that it becomes 1 for compositions when the (well layers 10W)/(barrier layers 10B) compositions are GaAs/Al$_{0.15}$Ga$_{0.85}$As, at 4 K. Therefore, each curve has been obtained by plotting the threshold current density $J_{th}$ at the second step, after the above-mentioned simulation was carried out for each composition. Also, FIG. 8 is a graph showing composition dependency of maximum operating temperature $T_{max}$ read from the numerical calculation prospects in FIG. 7. FIG. 8 has been obtained by conducting the above-mentioned simulation steps through the third step, and plotting values of temperature $T_{max}$ for respective compositions, where the values of temperature $T_{max}$ yield the maximum current density $J_{max}$ in Formula 5 for the allowable current density of the THz-QCL element 1000. It is to be noted that, since $J_{max}$ does not depend on the composition and temperature it will be indicated as a straight line with $J_{max}$.

From the results shown in FIG. 7, assuming that the normalized threshold current density $J_{th}$ can be kept constant, it is suggested that the heat sink temperature or operating temperature may be raised according to increase of the Al content. It is also suggested that, on the assumption that the operating temperature is kept constant, the normalized threshold current density $J_{th}$ is reduced according to increase of the Al content. Moreover, FIG. 7b also suggests that adding Al to both the well layers 10W and barrier layers 10B is advantageous than adding Al only to the barrier layers 10B as in FIG. 7a.

Such points are clearly seen also on FIG. 8. FIG. 8 is a graph of composition dependence of operating temperatures read from FIG. 7 on assumption that the threshold current density $J_{th}$ is constant in FIG. 7.

1-5. Practical Fabrication Example

Next, the THz-QCL element 1000 has been actually fabricated and its performance has been measured for several conditions.

1-5-1. Method of Manufacturing

Figure 9:
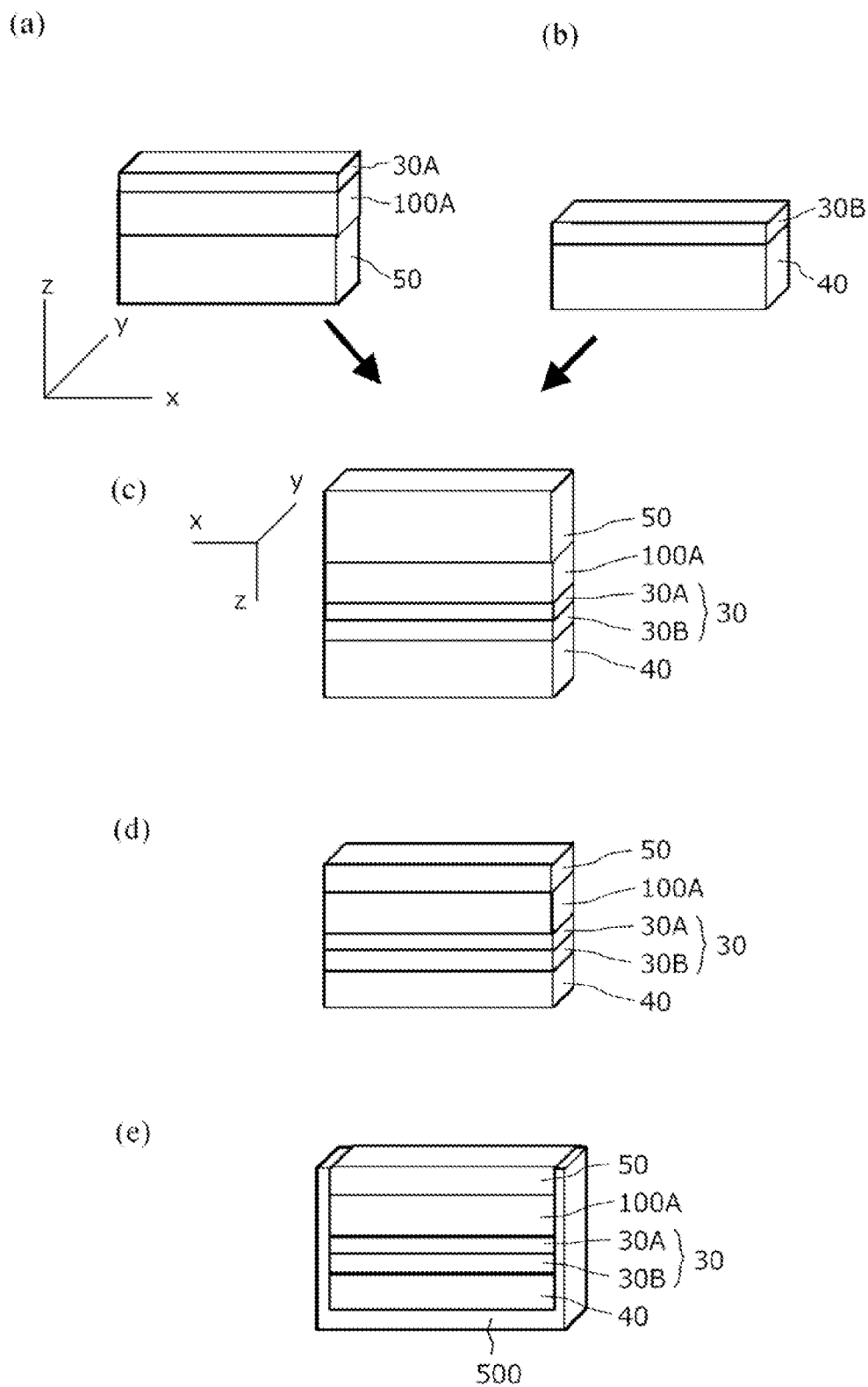
FIG. 9 is a schematic diagram of element structure at each step through fabrication of a THz-QCL element in an embodiment of the present invention.
Figure 10:
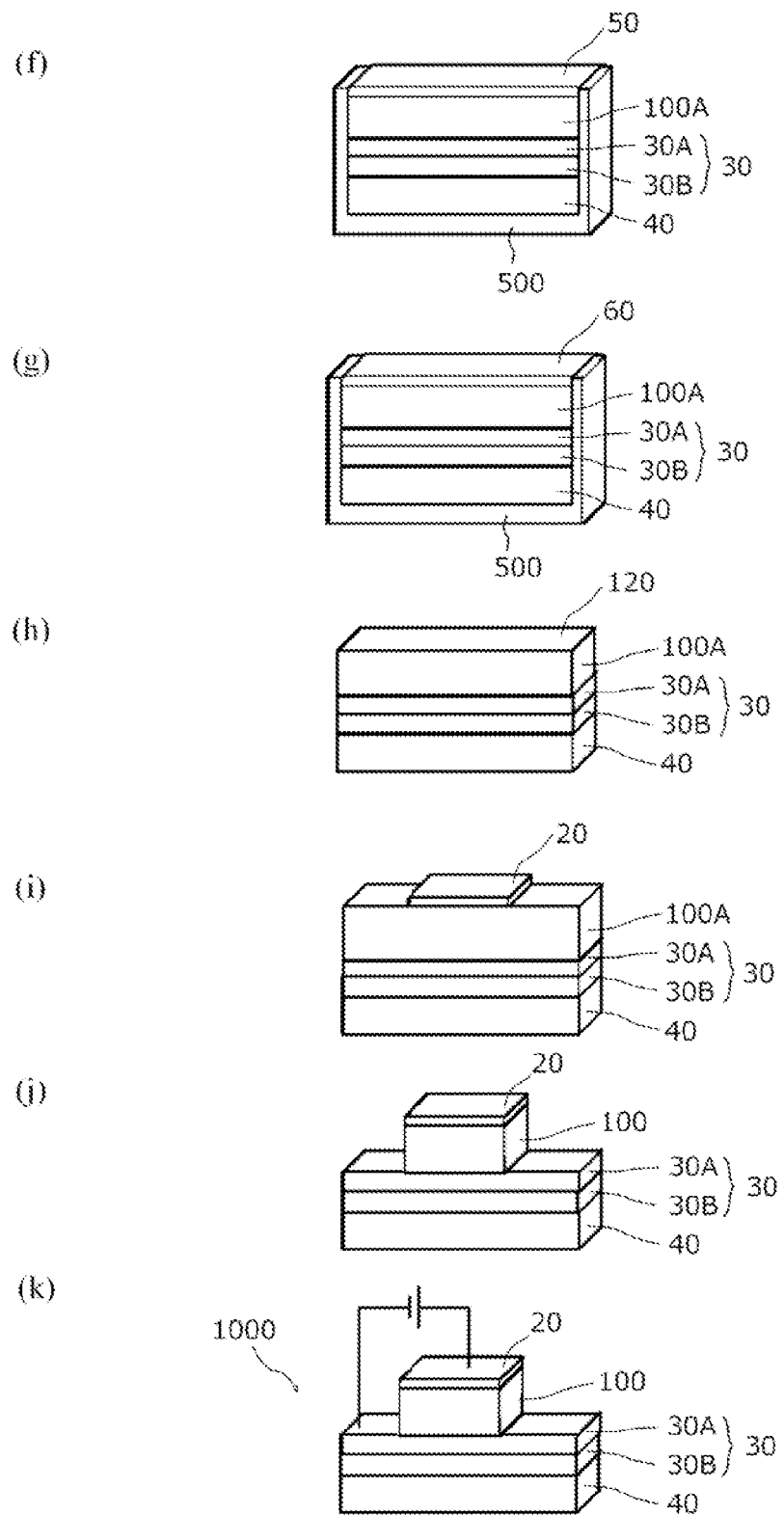
FIG. 10 is a schematic diagram of element structure at each step through fabrication of a THz-QCL element in an embodiment of the present invention.

The manufacturing method used for making the practical fabrication examples of THz-QCL element 1000 will be described. FIGS. 9 and 10 are schematic diagrams of an element structure at each step in manufacturing of THz-QCL element 1000 in the embodiment. First, the semiconductor superstructure 100A indicated in FIG. 1b is formed by coherent crystal growth on underlying crystal for each manufacturing step by molecular beam epitaxy (MBE) apparatus. In this regard, a single crystal GaAs substrate of orientation (100) is adopted for the substrate 50. Also, the ES layer 60 (FIG. 1b) is formed. The ES layer 60 is a layer with sufficient thickness, or 600 nm thick deposited layer of Al$_{0.5}$Ga$_{0.5}$As, as a layer enough resistive against etchant used when the substrate 50 is removed by etching later. Next, the highly doped GaAs layer 120 is formed. In so doing, its electron density is controlled to ~3×10$^{18}$ cm$^{-3}$ by way of doping. Thereafter, the active layer 10 is formed. The active layer 10 is formed to have stacked structure of the unit structures 10U in FIG. 1c. Compositions for the barrier layers 10B and the well layers 10W are adjusted for respective samples. The thicknesses of the layers are also adjusted to respective samples since the thicknesses are also re-designed according to the compositions of the barrier layers 10B and the well layers 10W. In an example for them, to reproduce a sample with a conventional structure having Al$_{0.15}$Ga$_{0.85}$As for the well layers 10W and GaAs for the barrier layers 10B, which is a sample corresponding to the lowest temperature curve in FIG. 7a, the barrier layer 10B1 through the well layer 10W4 in FIG. 1c are deposited, in particular, with thicknesses of 9.4/2.4/14.8/3.8/6.4/2.4/7.8/5.4 (nm) in this order. Next, the highly doped GaAs layer 140 is formed with 50 nm thickness. Regarding the highly doped GaAs layer 140, the electron density is controlled to ~5×10$^{18}$ cm$^{-3}$ by doping. Then the delta-dope GaAs layer 160, which becomes a contact layer, is formed. The delta-dope GaAs layer 160 consists of ten combined sets of 1 nm thick GaAs layer and a delta-dope layer. Then 5 nm thick low temperature grown GaAs layer (LTG-GaAs layer) 180 is formed. Thereafter, the metal layer 30A is formed as indicated in FIG. 9a. The metal layer 30A is formed, in the order of deposition, as Ta (20 nm)/Cu (600 nm)/Au (100 nm).

Also as indicated in FIG. 9b, the receptor 40 having metal layer 30B formed thereon, is provided. The metal layer 30B is formed to have similar structure to the metal layer 30A on the receptor 40 side.

Next, as indicated in FIG. 9c, overall layered structure is completed with wafer bonding, in which the metal layers 30A and 30B are pressed each other and heated for integration. The typical condition for this is heat treatment at 320 degree-C for 30 minutes while applying pressure of 36 kgf/cm$^2$ (about 3.5 MPa).

Thereafter, as indicated in FIG. 9d, by polishing the substrate 50 to 80 micrometer thick, and the receptor 40 to 20 micrometer thick, and as indicated in FIG. 9e, they are coated by the wax 500 except the outer surface of the substrate 50. It should be noted that the wax 500 is not depicted in FIG. 9a on a side parallel to the sheet of the drawing.

Next, as indicated in FIG. 10f, most part of the substrate 50 is removed by wet etching. The wet etching is carried out with etchant of H$_3$PO$_4$:H$_2$O$_2$:H$_2$O=1:1:1 (in volume fraction), with etchant temperature of 10 degree-C, for 10 minutes or so. Next, selective etching is carried out. The etchant adopted is (citric acid C$_6$H$_8$O$_7$:H$_2$O):H$_2$O$_2$=3:1 (in volume fraction), the etchant temperature is 40 degree-C, and the process time is for around 1-3 hours. As a result, the substrate 50 is removed, and the ES layer 60 is exposed to the surface as in FIG. 10g. Thereafter, to remove the ES layer 60, selective etching by buffered hydrofluoric acid (HF with NH$_4$F) is carried out. At this stage the ES layer 60 is removed and the highly doped GaAs layer 120 is exposed to the surface of the semiconductor structure 100A as indicated in FIG. 10h.

Furthermore, the electrode 20 is formed on the surface of the highly doped GaAs layer 120 of the semiconductor superlattice 100A (FIG. 10i). The electrode 20 is formed with Au of around 100 nm thickness that is patterned to have 200 micrometer width. The electrode 20 is used as a mask when removing periphery part of the semiconductor superlattice 100A by dry etching with chlorine gas to obtain QCL structure 100 with a mesa of 200 micrometer width, and a cavity with length of 0.5-1.5 mm is formed by cleaving (FIG. 10j). Lastly, by establishing electrical connections to the electrodes 20 and 30, the operable THz-QCL element 1000 is fabricated (FIG. 10k).

1-5-2. Samples

For the time being, what has been confirmed experimentally is related to only samples having modified composition in barrier layer indicated in FIG. 7a. More specifically, the samples for the practical fabrication example was obtained with varying x in GaAs/Al$_x$Ga$_{(1-x)}$As for x=0.15, 0.25, and 0.35.

1-5-3. Comparison of Results between Samples and Simulation

Figure 11:
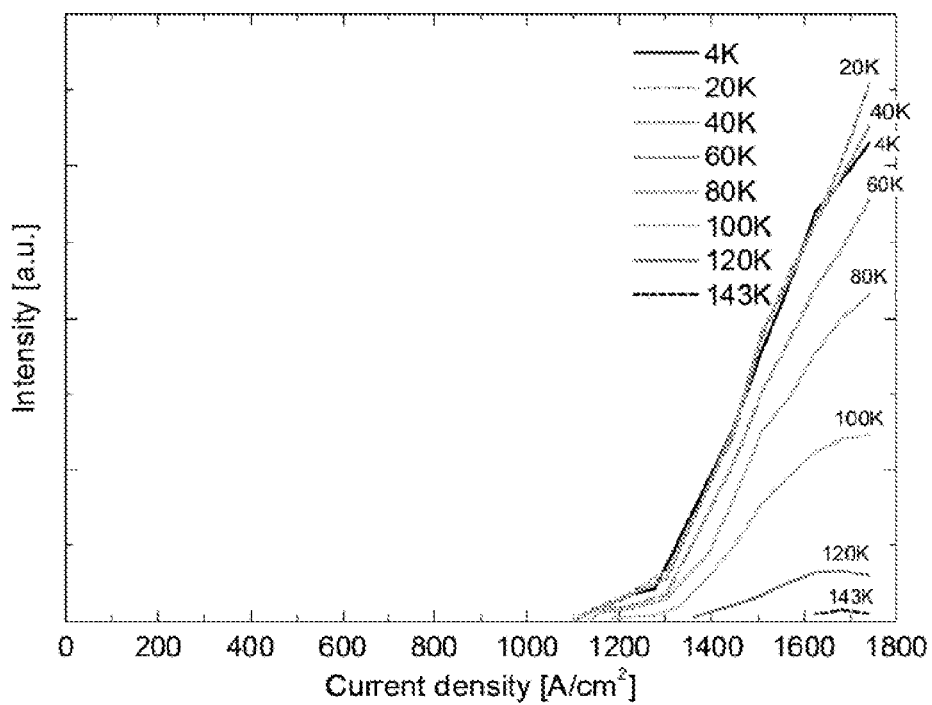
FIG. 11 depicts current emission characteristics (FIG. 11a) and a spectrum of electromagnetic wave emissions (FIG. 11b) obtained from an actually operated sample with x=0.15 in $GaAs/Al_xGa_{(1-x)}As$ for well layer/barrier layer compositions in a THz-QCL element in an embodiment of the present invention.
Figure 11:
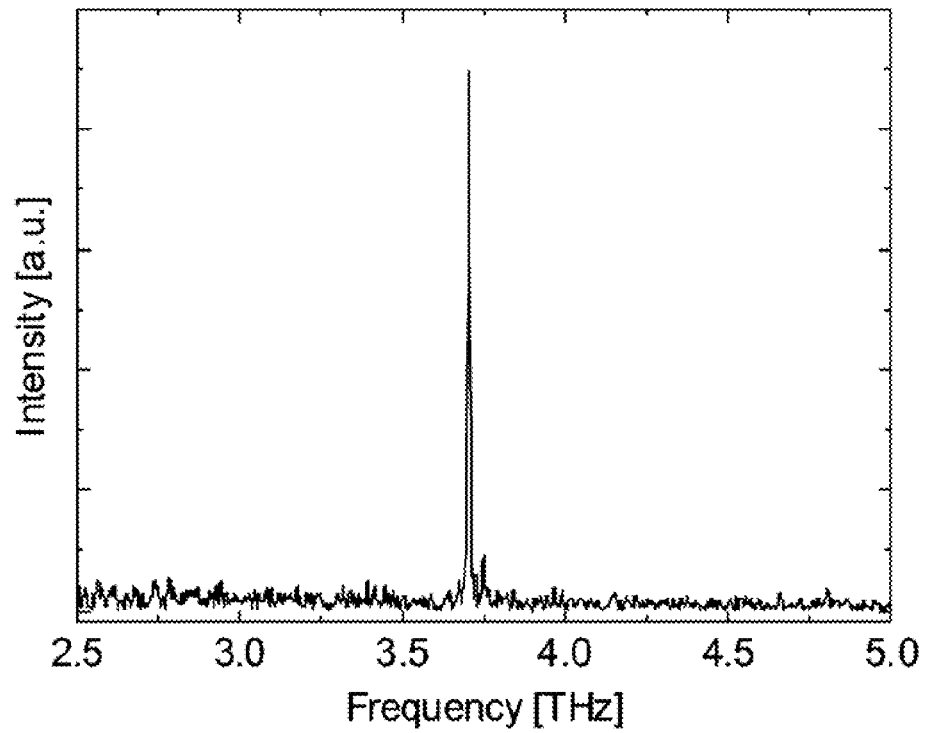
Figure 12:
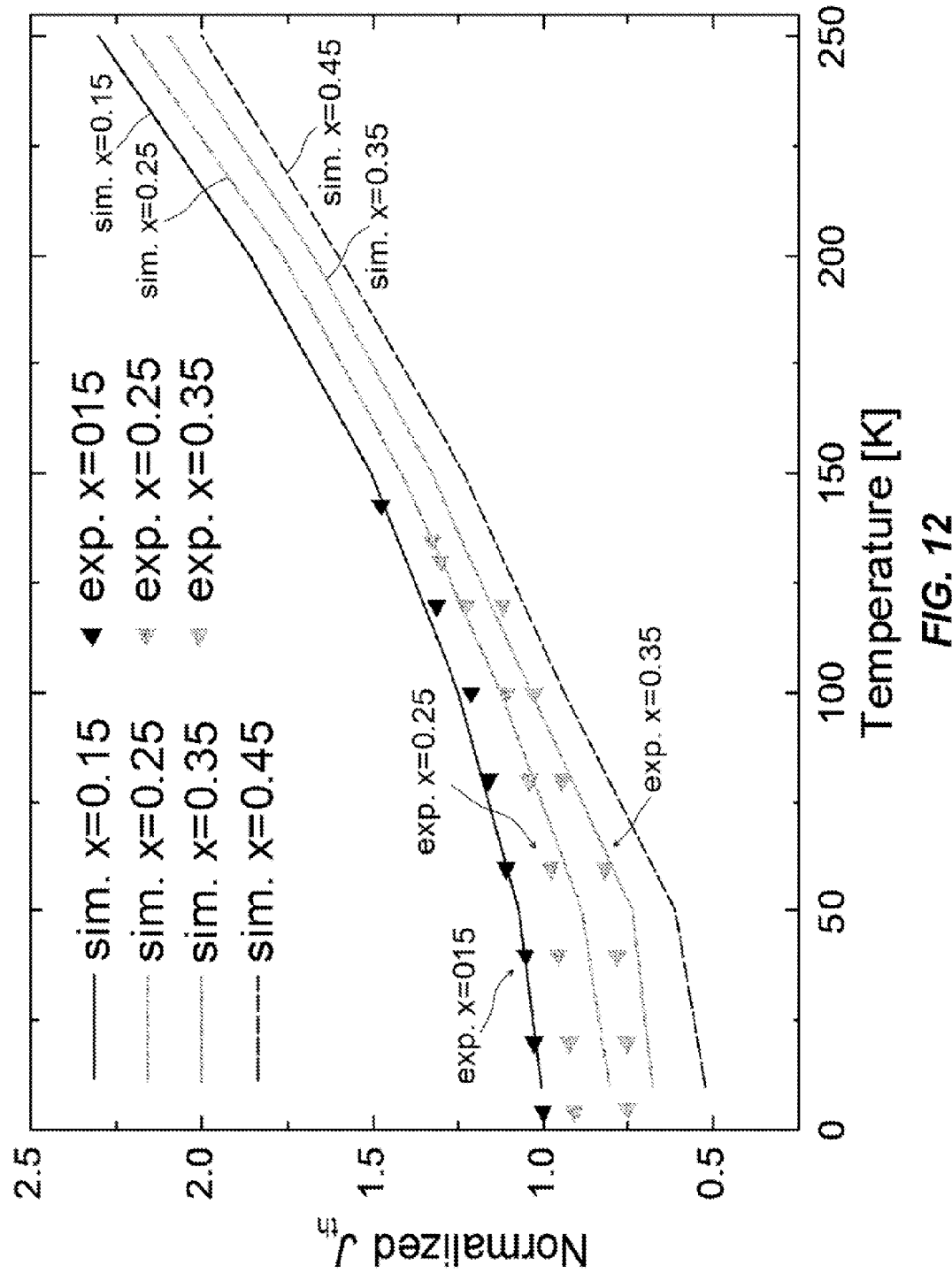
FIG. 12 is a graph showing characteristics obtained from a sample (exp.) and theoretical calculation prospects (sim.) corresponding to practical fabrication examples having structure of $GaAs/Al_xGa_{(1-x)}As$ with changing aluminum composition x, in an embodiment of the present invention.

Next, measurements have been made using samples for the practical fabrication example manufactured as described above, concerning the normalized threshold current density J$_{th}$ in respective temperatures. In addition, theoretical calculation has been carried out in line with the similar scheme of FIG. 7. FIG. 11 is a graph showing the measurement results of the samples of the practical fabrication example. FIG. 11 indicates current-emission characteristics (FIG. 11a) and spectrum of emitted electromagnetic waves (FIG. 11b) for an actually operated sample, with x=0.15 for composition of GaAs/Al$_x$Ga$_{(1-x)}$As for well layer/barrier layers in the THz-QCL element. FIG. 12 is a graph showing characteristics of samples (exp.) regarding practical fabrication example having structure of GaAs/Al$_x$Ga$_{(1-x)}$As for several aluminum composition x, and theoretical calculation prospects (sim.).

As indicated in FIG. 11, the lasing operation of a sample with x=0.15 in GaAs/Al$_x$Ga$_{1-x}$As was confirmed, at low temperature of 60 K or below, with the threshold current density of around 1250 A/cm$^2$. In addition, the maximum operating temperature was about 143 K for pulse operation with repetition frequency of 500 Hz. Also, as indicated in FIG. 12, as for the normalized threshold current density J$_{th}$, measured results with the practical fabrication example were fairly consistent with the theoretically calculated prospects. Particularly over 60 K temperature range, the measured results in samples and theoretically calculated prospects had great consistency with each other.

It follows that, the theoretical calculation scheme adopted in predicting the performances of the THz-QCL element 1000 can serve as a framework in explaining the relationship between the threshold current density J$_{th}$ and the operating temperature. That is, by comparing normalized threshold current densities J$_{th}$ for the same operating temperature in the actually measured data, it has been confirmed that the threshold current density J$_{th}$ was reduced according to increasing Al amount added. Also, by comparing operational temperatures for identical normalized threshold current densities, it has been confirmed that lasing operation was realized at higher temperature than before.

It should be noted that the maximum operating temperatures T$_{max}$ found in the samples in GaAs/Al$_x$Ga$_{(1-x)}$As are 143 K for x=0.15, 132 K for x=0.25, and 120 K for x=0.35. When only these results are concerned, it cannot be said that increasing Al addition amount actually raises the maximum operating temperature T$_{max}$ so far. The reason why actual samples show such behavior with the maximum operating temperature T$_{max}$ is unclear for the time being. However, the inventors of the present application have confirmed that good agreement was found generally between the theoretical calculation prospects and the experimental results. More specifically, it has been confirmed based on the experiment that there was correctness in the theoretical prediction with respect to the possibility of reduction in the threshold current density J$_{th}$ due to increasing Al addition, at temperature of 100 K or higher. Therefore, we have reason to believe that, based on the theoretical prediction, the maximum operating temperature T$_{max}$ is to be increased, by solving difficulties underlying in the experiment. Furthermore, it should be noted that, Al content was increased only for the barrier layers 10B in the experimental results mentioned above. We also believe in this regard that, if experiments are carried out by adding Al also to the well layers 10W and increasing the Al amount added thereto, the threshold current density J$_{th}$ will be reduced and the maximum operating temperature T$_{max}$ will be raised, as suggested by the calculation prospects in FIGS. 7b and 8b.

Embodiment 1

Variation Example

2. Additional Specific Structure

It should be noted that, although the materials in the well layers 10W and barrier layers 10B in the present embodiment as mentioned above are respectively set identical among the well layers 10W1-10W4 and among the barrier layers 10B1-10B4, the present invention is not limited to such combination of materials. It should be noted that, although the materials in the well layers 10W and barrier layers 10B in the present embodiment set forth above are respectively set identical among the well layers 10W1-10W4 and among the barrier layers 10B1-10B4, the present invention is not limited to such combination of materials.

Also, the THz-QCL element 1000 of the present embodiment can be modified to further specific configuration without departing the spirit of the present invention set forth herein. For example, ranges for x and y in the composition Al$_x$Ga$_{1-x}$As/Al$_y$Ga$_{1-y}$As (x<y≤1) of the (well layers 10W)/(barrier layers 10B) are not specifically limited except that they should satisfy x<y≤1. For example, both x and y may be set closer to 1 as much as possible, considering the LO-phonon energy E$_{LO}$ as stated above. However, since the potential barriers of the barrier layers 10B with relative to the well layers 10W are formed by the difference between x and y, the upper limit of x is set to a value smaller than 1 by a difference amount that is necessary to produce the potential barriers. On the other hand, since y does not have such an upper limit, most typically, y may be set to 1, or 100%.

3. Other Base Material

The technological concept that has been described in detail along with the THz-QCL element 1000 adopting material base of GaAs in the present embodiment can also be applied to other QCLs adopting other base material. As an example, QCLs with InP type compound semiconductor will be described for such variation. The InP base QCLs have been fabricated recently in bound-to-continuum type. Therefore, it is not easy to predict the threshold current density J$_{th}$, or to predict the maximum operating temperature T$_{max}$. This is because electron-electron scattering determines relaxation time in the bound-to-continuum type. As a result, merely considering LO-phonon energy and its scattering is insufficient for predicting the threshold current density J$_{th}$ and the maximum operating temperature T$_{max}$, and thus the outcome cannot be predicted in such a straight forward manner.

However, if we apply the approach of depopulation by the LO-phonon scattering to the InP base material and if we assume the situation in which the relaxation time is governed by the LO-phonon scattering as described in the present embodiment, increasing the Al addition would reduce the phonon mediated leak of the thermally excited electrons. More specifically, in the approach of the depopulation of electrons by way of the LO-phonon scattering, it is feasible to fabricate an active region having InAl$_x$Ga$_{1-x}$AsP for well layers and InAl$_y$Ga$_{1-y}$AsP for barrier layers (where x>y) on the InP substrate. It should be noted that, the maximum operating temperature T$_{max}$ is 115 K for bound-to-continuum type QCLs of THz range having conventional material system of InP/InGaAs/InAlAs. It can be said that, when operating a QCL fabricated with this material system based on the approach of the electron depopulation by the LO-phonon, increasing the content of Al would reduce the threshold current density $J_{th}$ and increase the maximum operating temperature $T_{max}$.

It shall be taken into account that growing crystals on InP by MBE while matching the crystal lattice is more delicate than for GaAs base material. Specifically, the lattice matching can be achieved only for a composition of $In_{0.53}Ga_{0.47}Al/In_{0.48}Al_{0.52}As$. Therefore, additional solution may be necessary for the crystal growth.

The embodiment of the present invention has been described specifically throughout the description set forth herein. Any parts of the description in this specification, including the embodiment, practical fabrication example, practical calculation example, and their variations, are provided for the purpose of explaining the present invention; therefore the scope of the invention should be determined based on recitations of the claims. Furthermore, any other variations based on any combination in the embodiment are included in the present invention, which variations should be also within a scope of the present invention.

INDUSTRIAL APPLICABILITY

According to the present invention, THz-QCLs with reduced threshold current density $J_{th}$ or THz-QCLs with raised maximum operating temperature $T_{max}$ are provided. These THz-QCLs are applicable to instruments that use an electromagnetic wave source of THz range.

REFERENCE SIGNS LIST 1000 element
100 QCL structure (semiconductor superlattice)
100A semiconductor superlattice
10 active region
10B, 10B1-10B5 barrier layer
10W, 10W1-10W4 well layer
10U unit structure
120, 140 highly doped GaAs layer
160 delta-dope GaAs layer
20, 30 electrode
30A, 30B metal layer
40 receptor
50 substrate
60 etch stop layer
500 wax
L1-L3 levels
2000 electromagnetic wave

What is claimed is:

1. A quantum cascade laser (QCL) element comprising a pair of electrodes and a semiconductor superlattice sandwiched by the pair of electrodes,
wherein the semiconductor superlattice has an active region that emits electromagnetic waves of THz range when a voltage is applied between the pair of electrodes,
wherein the active region has repeating unit structures, each unit structure having a thickness and including sets of a well layer and a barrier layer alternatingly laminated with each other,
wherein the well layer is made of $Al_xGa_{1-x}As$ (where $0<x<1$), which is a mixed crystal of AlAs and GaAs,
wherein materials of the semiconductor superlattice are configured to satisfy, when an voltage for emission of the electromagnetic waves is applied, $$E_{LO} > k_B T + E_{32},$$

where the $E_{LO}$ denotes energy of a longitudinal optical phonon that can be excited within the semiconductor superlattice, the $E_{32}$ denotes a difference value between minimum energy $E_3$ of the upper lasing level and minimum energy $E_2$ of a lower lasing level,
wherein the semiconductor superlattice is configured to satisfy, when the voltage is applied, $$E_{21} < E_{LO},$$

where the $E_{21}$ denotes a difference value between the minimum energy $E_2$ of the lower lasing level and minimum energy $E_1$ of a depopulation level, the T denoting operating temperature (unit: K), and the $k_B$ denoting Boltzmann constant, and
wherein the energy $E_{LO}$ of longitudinal optical phonons that can be excite in the interior of the semiconductor superlattice is greater than energy of longitudinal optical phonons that would be excited on the assumption that the well layer of the semiconductor superlattice were made of GaAs.

2. The QCL element according to claim 1,
wherein the materials of the semiconductor superlattice are configured to satisfy, when an voltage for emission of the electromagnetic waves is applied, $$E_{LO} > k_B T_{electron} E_{32},$$

where the $T_{electron}$ denotes electron temperature (unit: K),
whereby non-radiative transition probability for electrons is reduced, the non-radiative transition is transition with which electrons thermally excited in the upper lasing level to transition from the upper lasing level make the lower lasing level-mediated by electron-phonon scattering with the longitudinal optical phonons.

3. The QCL element according to claim 1,
wherein the semiconductor superlattice has an energy barrier layer made of AlAs.

* * * * *